United States Patent [19]
Lee et al.

[11] Patent Number: 5,858,084
[45] Date of Patent: Jan. 12, 1999

[54] CRYSTAL GROWTH UNDER THE COMBINED EFFECT OF GRAVITY AND MAGNETIC FIELD

[75] Inventors: Min-Chang Lee; Caroline H. Lee, both of Lexington, Mass.

[73] Assignee: Massachusetts Institute of Technology, Cambridge, Mass.

[21] Appl. No.: 808,120

[22] Filed: Feb. 28, 1997

[51] Int. Cl.$^6$ .................................................. C30B 30/04
[52] U.S. Cl. ............................... 117/32; 117/30; 117/917
[58] Field of Search ................................. 117/68, 32, 917

[56] References Cited

U.S. PATENT DOCUMENTS

| | | | |
|---|---|---|---|
| 3,634,044 | 1/1972 | Parker | 117/68 |
| 4,419,177 | 12/1983 | Pryor | 117/32 |
| 5,258,092 | 11/1993 | Yamagishi | 117/917 |
| 5,349,921 | 9/1994 | Barraclough | 117/32 |

OTHER PUBLICATIONS

"The Growth Rate of (100) Faces on Ammonium Dihydrogen Phosphate Monocrystals in Magnetic Fields," Žižic, et al, *J. Crystal Growth* 54 pp. 439–442 (1981).

"Effect of exposure to magnetism on crystals produced in aqueous solutions," Ohgaki, et al, *Chemical Engineering Science* 49 (6) pp. 911–913 (1994).

"Effect of an External Magnetic Field on Polytypism of CdI$_2$ Crystals Grown from Solutions," Palosz, et al, *Crystal Res. & Technol.* 17 (6) pp. 759–765 (1982).

"The Effects of Magnetic Fields on the Nucleation and Growth of Gypsum Crystals," Konak, *Kristall und Technik* 9 (12) pp. 1355–1360 (1974).

"Einfluss von magnetischen und elektromagnetischen Feldern auf die Kristallisation aus wässrigen Lösungen," Barta, et al, *Kristall und Technik* 9 (6) pp. 619–623 (1974) [In German; abstract in English].

"Application of Flow Ultramicroscopy to the Determination of Early Crystallization in a Magnetized Solution," Mikhel'son. *Kolloidnyi Zhurnal* 45 (2) pp. 352–355 (Mar.–Apr. 1983).

"Influence of External Fields on Nucleation and Crystal Growth," Evans, *J. Chemical Soc., Faraday Trans.* 1, 81 pp. 673–678 (1985).

"Factors Influencing the Distribution of Hydrates in Calcium Oxalate Precipitation," Brěcević, et al, *J. Crystal Growth* 970 pp. 460–468 (1989).

"Controling Crystallization of Potassium Chloride from Solution," Poilov, et al, *Industrial Crystallization* 81 pp. 391–392 (1982).

"The Influence of a Magnetic Field on the Mosaic Spread and Growth Rate of Small Rochelle Salt Crystals," Micrović, et al, *App. Phys. A* 51 pp. 374–378 (1990).

"Growth rate dispersion of small MnCl$_2$·4H$_2$O crystals: I. Growth without a magnetic field," Micrović, *J. Crystal Growth* 112 pp. 160–170 (1991).

"Growth rate dispersion of small MnCl$_2$·4H$_2$O crystals: II. Growth in a magnetic field," Micrović, *J. Crystal Growth* 112 pp. 171–182 (1991).

"Champs Magnetiques Statiques dans la Synthese des Materiax; Etude Experimentale de Systemes Modeles," Baugnon, Doctoral thesis, Institut National Polytechnique de Grenoble (Frace) NTIS No. PB94–201266/HDM, 149p (Mar. 1992) [Abstract only].

"Characterization of Convection Related Defects in II–VI Compound Semiconductors," Witt, NASA–CR–194704, NTIS No. N94–21778/3/HDM, 13p (Dec. 1993) [Abstract only].

(List continued on next page.)

*Primary Examiner*—Felisa Garrett
*Attorney, Agent, or Firm*—Choate, Hall & Stewart

[57] ABSTRACT

A method of growing crystals from solution is described which includes growing crystals from a solution comprising ions under the combined effect of gravity and an applied magnetic field, in which the magnetic field in the range of about 1 to 10 times the strength of the Earth's magnetic field.

18 Claims, 2 Drawing Sheets

OTHER PUBLICATIONS

"Experimental Observation of the Influence of Furnace Temperature Profile on Convection and Segregation in the Vertical Bridgeman Crystal Growth Technique," Neugebauer, et al, NTIS No. N93–15312/0/HDM, 6p (Oct. 1992) [Abstract only].

"Growth and Novel Properties of Magnetic Heterostructures by Molecular Beam Epitaxy," Hong, et al, NTIS No. AD–A254 206/6/HDM, 9p (1991) [Abstract only].

"Processing, Fabrication, Characterization and Device Demonstration of High Temperature Superconducting Ceramics," Luhman, et al, NTIS No. AD–A290 183/3/HDM, 291p (Nov. 1994) [Abstract only].

"Solidification of Tin in the Presence of Electric and Magnetic Fields," Vivés, *J. Crystal Growth* 76 pp. 170–184 (1986).

"Control of Crystallization Processes by Means of Magnetic Fields," Mikelson, *J. Crystal Growth* 52 pp. 524–529 (1981).

"Material processing in high static magnetic field. A review of an experimental study on levitation, phase separation, convection and texturation," Beaugnon, et al, *J. Phys. I France* 3 pp. 399–421 (Feb. 1993).

CRYSTAL GROWTH UNDER THE COMBINED EFFECT OF GRAVITY AND MAGNETIC FIELD

The United States Government may have certain rights to this invention by virtue of United States Contract No. AFOSR F49620-95-1-0156.

FIELD OF THE INVENTION

The present invention relates to the growth of crystals from solution under an applied magnetic field.

BACKGROUND OF THE INVENTION

The preparation of high purity crystals is of interest in a range of scientific and industrial applications; however, macroscopic and microscopic fluctuations of composition which commonly occur in solution, make it a challenge to obtain high quality crystals.

There has been considerable investigation of the effect of magnetic field on crystal growth. Several reports suggest that a magnetic field affects the growth of crystals from an aqueous solution. Thus, application of a magnetic field decreases the growth rate of ammonium dihydrogen phosphate (Zizic et al. *J Crystal Growth* 54:439 (1981)) and Rochelle salts (Mitrovic et al. *Appl. Phys. A* 51:374 (1990)). On the other hand, application of a magnetic field increases the growth rate of $Fe(NH_4)_2(SO_2)_2$ (M. Schieber *J Crystal Growth* 1:131 (1967). Other studies have reported an effect of a magnetic field on phase composition in polytypic crystals (B. P. J. Prezedmojski *Crystal Res. & Technol.* 17:759 (1982)). In all these studies, very high magnetic field strengths in the order of 5000–20,000 Gauss (0.5–2.0 T) were applied. The effect of weak magnetic fields on crystal growth from aqueous solutions has not been investigated.

It has been known that space-grown crystals differ from those grown on Earth. As observed in the 1988 Shuttle Discovery experiment in a microgravity environment and a magnetic field which was about 80–90% of the Earth's magnetic field, lead iodide crystals grew uniformly throughout the solution and also uniformly on a membrane in the experimental chamber. This was very different from lead iodide crystals grown in laboratories on Earth, where the crystals grew only at the vertical membrane and then only at the bottom half of the membrane. [Scaife et al. Chem. Mater. 2:777 (1990)].

It is the object of the present invention to provide a method of growing crystals from solution under the combined effect of gravity and low magnetic field strengths.

It is a further object of the present invention to provide a method for crystal growth in which the growth location, size and crystal quality may be controlled.

SUMMARY OF THE INVENTION

In one aspect of the invention, a method of growing crystals from solution includes growing crystals from a solution comprising ions under an applied magnetic field, in which the magnetic field in the range of about 1 to 200 times, preferably 1 to 50 times and more preferably 1 to 10 times the strength of the Earth's magnetic field. In other embodiments of the invention, the applied magnetic field is in the range of about 0.5 to 100 Gauss, preferably about 0.5 to 25 Gauss, and more preferably about 0.5 to 5 Gauss.

In preferred embodiments, the applied magnetic field is aligned with the horizontal component of the Earth's magnetic field. In other embodiments, the applied magnetic field opposes or reinforces the horizontal component of the Earth's magnetic field. The applied magnetic field may be equal to and opposing the horizontal component of the geomagnetic field, whereby the solution experiences a near zero effective magnetic field. In other embodiments of the invention, the magnetic field is generated using a solenoidal coil and the solenoid is oriented along a magnetic north-south direction.

In other embodiments of the invention, the crystallizing condition comprises evaporation of solvent, reducing the solution temperature, or use of seed crystals and other nucleation promoting techniques. The applied magnetic field may be selected to promote crystal growth throughout the solution or it may be selected to promote crystal growth in an eastern and western portion of the solution relative to magnetic north.

The invention may further include a barrier to within the crystal growth solution located so as to hinder ionic drift experienced by ion in solution in the presence of the applied magnetic field.

BRIEF DESCRIPTION OF THE DRAWING

The invention is described with reference to the Figures which are provided for the purposes of illustration only and in which.

DETAILED DESCRIPTION OF THE PREFERRED EMBODIMENT

Figure 1:
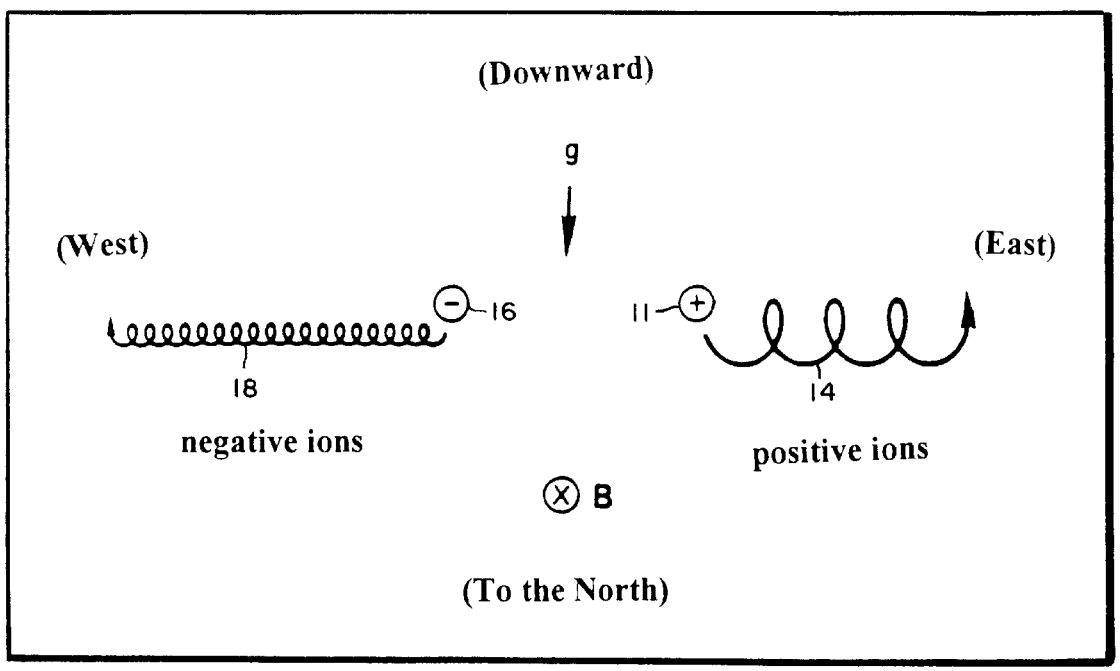
FIG. 1 is an illustration of the combined effect of the earth's magnetic field and gravity on negatively and positively charged ions.

According to the invention, crystals are grown in a solution while the solution is exposed to a weak magnetic field. The magnetic field in preferably in the range of one to ten times the strength of the earth's background magnetic field, or geomagnetic field. Since the earth's magnetic field is approximately 0.5 Gauss, the present invention calls for application of a magnetic field that is in the range of about 0.5 to 100 Gauss, and preferably about 0.5 to 25 Gauss and most preferably about 0.5 to 5 Gauss. Magnetic field strengths of about 0.5–5 Gauss were found to have significant effects on non-saturated ionic solutions. It is contemplated that super-saturated solutions may require somewhat stronger magnetic fields, e.g. up to about 100 Gauss, because ion cross-field diffusion can be large in super-saturated solutions.

"Earth's magnetic field" or "geomagnetic field", as those terms are used herein means the magnetic field experienced by a body at its particular location on the earth's surface. The magnetic field varies in strength and in orientation over the surface of the earth. There is a vector component to the field. At the equator the geomagnetic field is substantially parallel to the earth's surface. At the poles, the field is substantially perpendicular to the earth's surface, In the intervening regions, the field has both a horizontal and vertical components.

Because the vertical component of the earth's magnetic field will result in a cross product of zero, the present invention is concerned with a horizonal component of the earth's magnetic field, which strength varies with location on the earth's surface. The horizontal component of the earth's magnetic field is defined by the equation, $B=0.5 \cos \theta_G$, where $\theta$ is the dip angle. Thus, at the equator, the horizontal component is equivalent to the earth's magnetic field ($\cos \theta=1$), whereas at the poles, the horizontal component of the earth's magnetic field is near zero ($\cos \theta=0$).

In preferred embodiments, the applied magnetic field is aligned with the horizontal component of the geomagnetic field. The applied magnetic field may oppose or reinforce the geomagnetic field. By alignment of the applied field with the geomagnetic field, the forces to which the ions in solution are subjected is simplified because the applied field vector either negates or reinforces naturally occurring ionic movement in solution. Where the applied field vector is different than the geomagnetic field vector, the ions are subjected to different and perhaps conflicting forces.

According to the method of the invention, a relatively uniform magnetic field with intensities comparable to one to ten times the Earth's magnetic field is produced. The magnetic field may be produced using any conventional apparatus and technique. A relatively simple way of generating a magnetic field is through use of solenoidal coils carrying current.

The crystal growth method of the invention may be used with any solution containing ions which will combine to form a crystalline product. The solution may contain only those ions (positive and negative for charge balance) which are used to form the crystalline product. Alternatively, the solution may contain a plurality of ions, such that, under crystallization conditions, the desired crystalline product is formed. The latter is possible where the ions in solution experience different solvation strengths in solution. The solvent may be either an organic or aqueous solvent so long as the appropriate ions are soluble therein. Suitable solvents include water, acetone, DMSO, etc.

Any conventional techniques used in the crystallization of compounds which are formed by association of one or more cations and one or more anions in solution may be used in the present invention. The known crystallization techniques are numerous. Exemplary techniques include, removal of solvent by evaporation, reducing solution temperature or any other way of creating a saturated solution. In additions, nucleation aides, such as seed crystals, may be used according to the invention.

Using the crystal growth method of the invention, the uniformity of crystal growth and the size and yield of grown crystals may be controlled by the combined effect of gravity and magnetic field. While not being bound by any particular mode of operation, it is believed that the method of the invention takes advantage of the combined effects of gravity and magnetic field on the ionic species in solution. Anions and cations in solution, due to their mass and electrical charge, will be responsive to the combined effects of gravity (g) and magnetic field (B) which may be defined by their cross product, g×B. Cation and anion movement (or "ionic drift") in solution are effected by the magnitude and sign of this cross product. Ionic species of opposite charges will drift and oscillate in opposite directions, as is depicted in FIG. 1.

With reference to FIG. 1, gravity is indicated by the downward arrow labeled "g" and magnetic field is indicated by the outwardly projecting arrow labeled "B". The magnetic field is oriented with the geomagnetic field, and therefore B is oriented to the north. The combined effect of gravity and magnetic field results in the cation 11 gyrating to the right (as indicated by arrow 14) and the anion 16 gyrating to the left (as indicated by arrows 18). Where the magnetic field is aligned with the geomagnetic field, cations will move to the east and anions to the west. The greater the mass of the ion, the wider and slower the helical motion in solution. Light ions have slow drift speeds and therefore have tight corkscrew pathways (see, FIG. 1). The expression for the g×B-driven drift speed of ions is given by mg/qB, where m and q denote mass and electric charge of ions, respectively. Thus, the cross product g×B suggests that the drifting motions of the cations (q>0) and anions (q<0) will be in opposite directions. It is only where the motion of the ions is hindered, such as at membrane interfaces and vessel surfaces, that ions may combine to form a crystalline lattice.

This theory is consistent with observations of crystal growth in space and on Earth. At an altitude of about 300 km, the space shuttle experiences a magnetic field of about 87% of that on earth. The gravity force, in contrast, is reduced drastically by several orders of magnitude because, under the circular orbit of the shuttle, the gravitational field is almost canceled by the centrifugal force, i.e., microgravity conditions exist. The cross product g×B therefore is exceedingly small and one predicts that the combined effect of gravity and geomagnetic field does not cause anions and cations to drift or move about significantly in space (absent other driving forces, such as thermal or chemical potential gradients). Consequently, lead iodide crystals may grow uniformly throughout the solution in addition to at a vertical membrane, as was observed in the Shuttle Discovery experiments. [Scaife et al., 1990].

Thus on earth, conditions which mimic the small g×B conditions of the space shuttle are expected to show similar crystallization patterns. Since gravity is not readily altered on earth, it is more practical to alter the magnetic field. By significantly reducing the strength of the effective magnetic field experienced by the solution, the cross product g×B can be significantly reduced. By reducing the combined effect of gravity and magnetic field on ions in solution, ionic drift is reduced and ion combination and crystallization may occur under more controlled conditions.

The invention is described in the following examples, which are presented for the purpose of illustration only. The full scope and spirit of the invention are set forth in the claims which follow.

A crystallizing solution of aluminum potassium sulfate was prepared by combining boiling deionized water and powdered aluminum potassium sulfate (0.22 g/cc) in a crystal growing cup and stirring until all the powder had dissolved completely. Aluminum potassium sulfate then was crystallized from an aqueous solution under a variety of applied magnetic fields which were generated using a solenoidal coil. Currents of about 0.1 A (generated by DC power source) were used to produce a relatively uniform magnetic field (about 0.5 Gauss) near the center of the solenoid helical coil.

Crystal growth was conducted under varying magnetic field strengths and the course of the crystallization and the quality of the crystals thus obtained were evaluated. Crystal growth was investigated under the following effective magnetic field strengths: (1) nearly zero effective magnetic field; (2) the background geomagnetic field (~0.5 G); (3) twice the geomagnetic field (~1.0 G); and (4) three times the geomagnetic field (~1.5 G). Effective magnetic field strength refers to the magnetic field strength experienced by the solution, taking into account the existence of background geomagnetic field. In all experiments, the solenoid was aligned along the north-south direction, producing a magnetic field which either reinforced or opposed the geomagnetic field.

The resultant solution was placed in a preselected magnetic field and was not disturbed for five days. Crystal growth solutions were placed in the center of the coil, where the magnetic field was most uniform. Crystal growth was monitored during that time.

Figure 2:
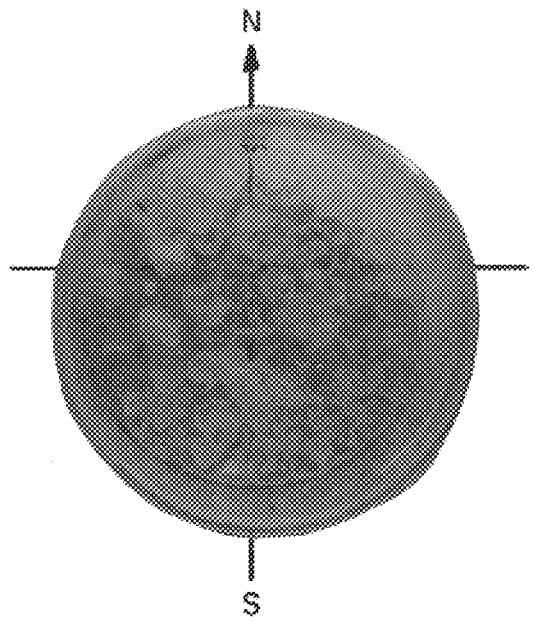
FIG. 2 is a photograph of crystals grown under nearly zero effective magnetic field.

Background geomagnetic field. A control solution was crystallized outside the solenoid under the background geomagnetic field. Tiny needlelike crystals of aluminum potassium sulfate grew on the surface of the solution and at the bottom of the crystallizing container, as is shown in FIG. 2. Crystal were of uniform size of less than one centimeter. The direction north, corresponding to the horizontal component of the geomagnetic field, is specified by an arrow labeled "N". This is consistent with the expected ionic drift of the cations and anions in solution under g×B forces as put forth in the theory described hereinabove. The solution/air interface and the solution/container interfaces provide interactions between the ions and the interfaces which serve to hinder and slow the ionic drift of the cations and anions. Where such hindrance occurs, e.g., on the container wall and solution surface, the ions may concentrate, nucleate and crystallize.

Figure 3:
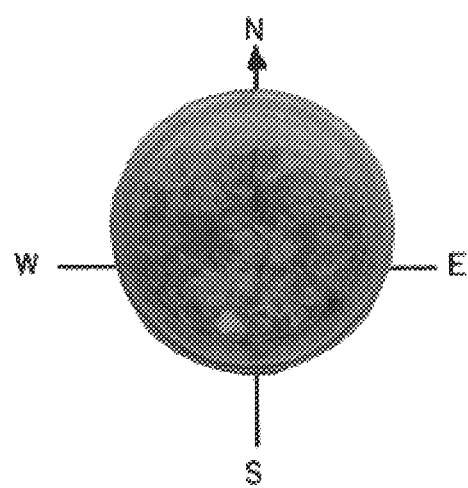
FIG. 3 is a photograph of crystals grown under the background Earth's magnetic field.

Zero effective magnetic field. A nearly zero magnetic field was produced in the solenoid by producing a magnetic field that was equal to but opposing the Earth's magnetic field. After five days, solutions experiencing the zero magnetic field contained crystals on the bottom of the container, but not on the surface of the solution, as is shown in FIG. 3. The crystals were of uniform size and somewhat larger than the control crystals grown under normal background geomagnetic field. The Extent and nature of the crystallization were monitored with time. In the absence of a g×B force, ionic drift is minimized and the crystals are formed uniformly throughout the solution. Because of gravity, the crystals were deposited at the bottom of the container, as the theory would predict.

Figure 4:
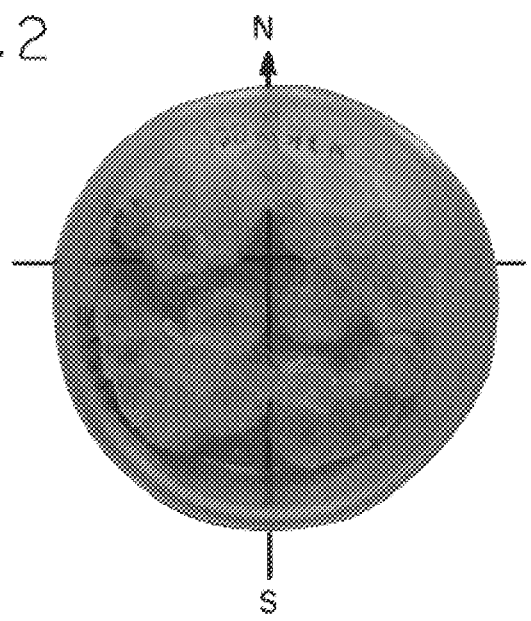
FIG. 4 is a photograph of crystals grown under twice the Earth's magnetic field.
Figure 5:
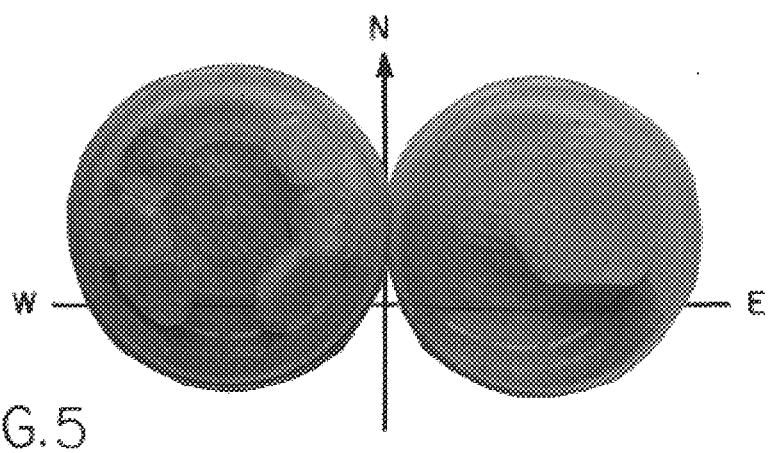
FIG. 5 is a photograph of crystals grown under three times the Earth's magnetic field.

Two and three times geomagnetic field. An effective magnetic field two or three times the geomagnetic field was produced in the solenoid by applying a magnetic field that reinforced the Earth's magnetic field. After five days under such conditions, the crystal growth solutions contained only a few (or even just one) large crystal(s), as is shown in FIGS. 4 and 5. The results of crystal growth under stronger magnetic fields was striking. Under three times the Earth's magnetic field, crystals were always seen to grow against the east and/or west walls of the crystal growth container (see, FIG. 5), clearly indicating that g×B-driven motion of the ions in the crystal growth solution were hindered by the wall for crystal growth. Also, shown in FIG. 5 is the more often observed case of a singly grown crystal with a linear dimension of several centimeters. Enhanced crystal growth was observed from crystal growth solutions under magnetic fields only moderately greater than the Earth's magnetic field.

The observed increase in the crystal size and rate of growth in solutions under two-fold and three-fold geomagnetic field strengths may be explained by consideration of the interplay of ionic drift (defined by g×B) and cross-field diffusion. Cross-field diffusion is inversely proportional to the applied magnetic field. The g×B drifts of ions is towards the east and west (relative to magnetic north) and further progress is hindered by the wall of the crystallization container. Excess charge (either negative or positive) accumulates at the western and eastern walls. In contrast, the cross-field diffusion of ions is away from the wall. While the g×B drifts of ions are constrained by the wall of the container, thereby increasing ion density, the cross-field diffusion of ions results in reduction of ion density during the crystallization process. Due to the inverse relationship between magnetic field and cross-field diffusion, increasing the magnetic field can effectively reduce the cross-field diffusion of ions. Consequently, the formation of crystals near the wall of the container is facilitated under the g×B effect.

As is demonstrated in the above examples, increasing the applied field by two or three times the Earth's magnetic field, the cross-field diffusion was significantly reduced to allow crystal growth near the wall of the container.

Under very intense magnetic fields, such as 0.5–2.0 Tesla, used in earlier studies of magnetic field effects on crystal growth (e.g., Zizic et al., 1981; Mitrovic et al, 1990; Schieber, 1967; and Prezedmojski, 1982), both the g×B drifts and cross-field diffusion of ions are essentially suppressed (since drift speed is inversely proportional to B according to the equation mg/qB, leading to uniform growth of crystals in the solution). Thus, is it unlikely to grow large crystals under intense magnetic fields. As clearly demonstrated, in the present invention large crystals may be grown in high yields under the combined effect of gravity and weak magnetic fields.

The interested reader is directed to Lee and Lee in "Combined Effect of Gravity and Geomagnetic Field on Crystal Growth", *Geophysical Research Letters*, 24(5):607–610, (1997), which is incorporated herein in its entirely by reference, for further discussions.

Other embodiments of the invention will be apparent to the skilled in the art from a consideration of the specification or practice of the invention disclosed herein. It is intended that the specification and examples be considered as exemplary only with the true scope and spirit of the invention being indicated by the following claims.

We claim:

1. A method of growing crystals from solution, comprising:
   growing crystals from a solution, said solution comprising ions suitable for crystal growth; and
   applying a magnetic field to the solution during crystal growth, said magnetic field being applied in the range of about 1 to 200 times the strength of the Earth's magnetic field.

2. The method of claim 1, wherein the applied field is in the range of about 1 to 50 times the strength of the Earth's magnetic field.

3. The method of claim 1, wherein the applied magnetic field is in the range of about 1 to 10 times the strength of the earth's magnetic field.

4. The method of claim 1, wherein the applied magnetic field is in the range of 0.5 to 25 Gauss.

5. The method of claim 1, wherein the applied magnetic field is in the range of 0.5 to 5 Gauss.

6. The method of claim 1, wherein the applied magnetic field is aligned with a horizontal component of the Earth's magnetic field.

7. The method of claim 6, wherein the aligned magnetic field opposes the horizontal component of the Earth's magnetic field.

8. The method of claim 6, wherein the aligned magnetic field reinforces the horizontal component of the Earth's magnetic field.

9. The method of claim 6, wherein the applied magnetic field is selected to promote crystal growth in an eastern and western portion of the solution relative to magnetic north.

10. The method of claim 1, wherein the applied magnetic field is equal to and opposing the horizontal component of the geomagnetic field, whereby the solution experiences a near zero effective magnetic field.

11. The method of claim 1, wherein the magnetic field is obtained by using a solenoidal coil.

12. The method of claim 11, wherein the solenoid is oriented along a magnetic north-south direction.

13. The method of claim 1, wherein crystallization occurs under crystallizing condition comprising evaporation of solvent.

14. The method of claim 1, wherein crystallization occurs under crystallizing condition comprising reducing the solution temperature.

15. The method of claim 1, wherein crystallization occurs under crystallizing condition comprising the use of seed crystals and other nucleation promoting techniques.

16. The method of claim 1, wherein the applied magnetic field is selected to promote crystal growth throughout the solution.

17. The method of claim 1, further comprising providing a barrier to within the crystal growth solution located so as to hinder ionic drift experienced by ion is solution in the presence of the applied magnetic field.

18. A method of growing crystals from solution, comprising:

growing crystals from a solution, said solution comprising ions suitable for crystal growth; and applying a magnetic field to the solution during crystal growth, wherein the applied magnetic field is in the range of 0.5 to 100 Gauss.

\* \* \* \* \*